US012660603B2

(12) United States Patent
Chen et al.

(10) Patent No.:  US 12,660,603 B2
(45) Date of Patent:  Jun. 16, 2026

(54) HYBRID CUT METAL GATE TO ACHIEVE MINIMUM CELL PITCHES, REDUCING ROUTING AND RISING THE YIELD

(71) Applicant: TAIWAN SEMICONDUCTOR MANUFACTURING COMPANY, LTD., Hsinchu (TW)

(72) Inventors: Chin-Liang Chen, Hsinchu (TW); Chi-Yu Lu, Hsinchu (TW); Ching-Wei Tsai, Hsinchu (TW); Chun-Yuan Chen, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 590 days.

(21) Appl. No.: 18/158,137

(22) Filed: Jan. 23, 2023

(65) Prior Publication Data

US 2024/0088030 A1      Mar. 14, 2024

Related U.S. Application Data

(60) Provisional application No. 63/375,410, filed on Sep. 13, 2022.

(51) Int. Cl.
H10D 86/00      (2025.01)
H10D 84/01      (2025.01)
(Continued)

(52) U.S. Cl.
CPC ........ H10W 20/43 (2026.01); H10D 84/0149 (2025.01); H10D 84/0151 (2025.01);
(Continued)

(58) Field of Classification Search
CPC .............. H01L 23/528; H01L 23/5226; H01L 21/76897; H10D 84/0149; H10D 84/0151;
(Continued)

(56) References Cited

U.S. PATENT DOCUMENTS 9,595,536 B1 *  3/2017  Haigh .................. H10D 84/907
2014/0027918 A1 *  1/2014  Rashed .................. H10D 89/10
257/E21.59

(Continued)

FOREIGN PATENT DOCUMENTS

TW      201924021      6/2019
TW      202046503      12/2020
(Continued)

*Primary Examiner* — Marlon T Fletcher
*Assistant Examiner* — Da Wei Lee
(74) *Attorney, Agent, or Firm* — Hauptman Ham, LLP

(57)      ABSTRACT

Provided are semiconductor devices that include a first gate structure having a first end cap portion, a second gate structure having a second end cap portion coaxial with the first gate structure, a first dielectric region separating the first end cap portion and the second end cap portion, a first conductive element extending over the first gate structure, a second conductive element extending over the second gate structure, and a gate via electrically connecting the second gate structure and the second conductive element, with the first dielectric region having a first width and being positioned at least partially under the first conductive element and defines a spacing between the gate via and an end of the second end cap portion that exceeds a predetermined distance.

20 Claims, 10 Drawing Sheets

(51) Int. Cl.
    *H10D 84/03*       (2025.01)
    *H10W 20/42*      (2026.01)
    *H10W 20/43*      (2026.01)

(52) U.S. Cl.
    CPC ........... *H10D 84/038* (2025.01); *H10D 86/00*
                (2025.01); *H10W 20/42* (2026.01)

(58) Field of Classification Search
    CPC .. H10D 84/038; H10D 86/00; H10D 30/6735;
            H10D 30/6757; H10D 62/121; H10D
                 84/0135; H10D 84/83
    See application file for complete search history.

(56)             References Cited

U.S. PATENT DOCUMENTS

| | | | |
|---|---|---|---|
| 2016/0233298 A1* | 8/2016 | Webb ................... | H10D 62/115 |
| 2020/0411376 A1 | 12/2020 | Wang et al. | |
| 2021/0193528 A1* | 6/2021 | Tsai ..................... | H10D 84/834 |
| 2021/0210385 A1 | 7/2021 | Pethe et al. | |
| 2022/0223517 A1 | 7/2022 | Wang et al. | |
| 2022/0254927 A1 | 8/2022 | Cheng et al. | |

FOREIGN PATENT DOCUMENTS

| | | |
|---|---|---|
| TW | 202107568 | 2/2021 |
| TW | 202213786 | 4/2022 |
| TW | 202220101 | 5/2022 |
| TW | 202226532 | 7/2022 |

\* cited by examiner

100A

100B

400A

| 402 | FORM GATE STRUCTURES ON A SUBSTRATE |

| 404 | PATTERN AND ETCH 1$^{ST}$ CUT POLY (CPO) OPENING |

| 406 | FILL 1$^{ST}$ CPO OPENING WITH A 1$^{ST}$ DIELECTRIC MATERIAL |

| 408 | REMOVE A 1$^{ST}$ BACKSIDE PORTION OF THE SUBSTRATE |

| 410 | PATTERN AND ETCH 2$^{ND}$ CPO OPENING AND REMOVE A PORTION OF THE 1$^{ST}$ DIELECTRIC MATERIAL |

| 412 | FILL 2$^{ND}$ CPO OPENING WITH A 2$^{ND}$ DIELECTRIC MATERIAL |

400B

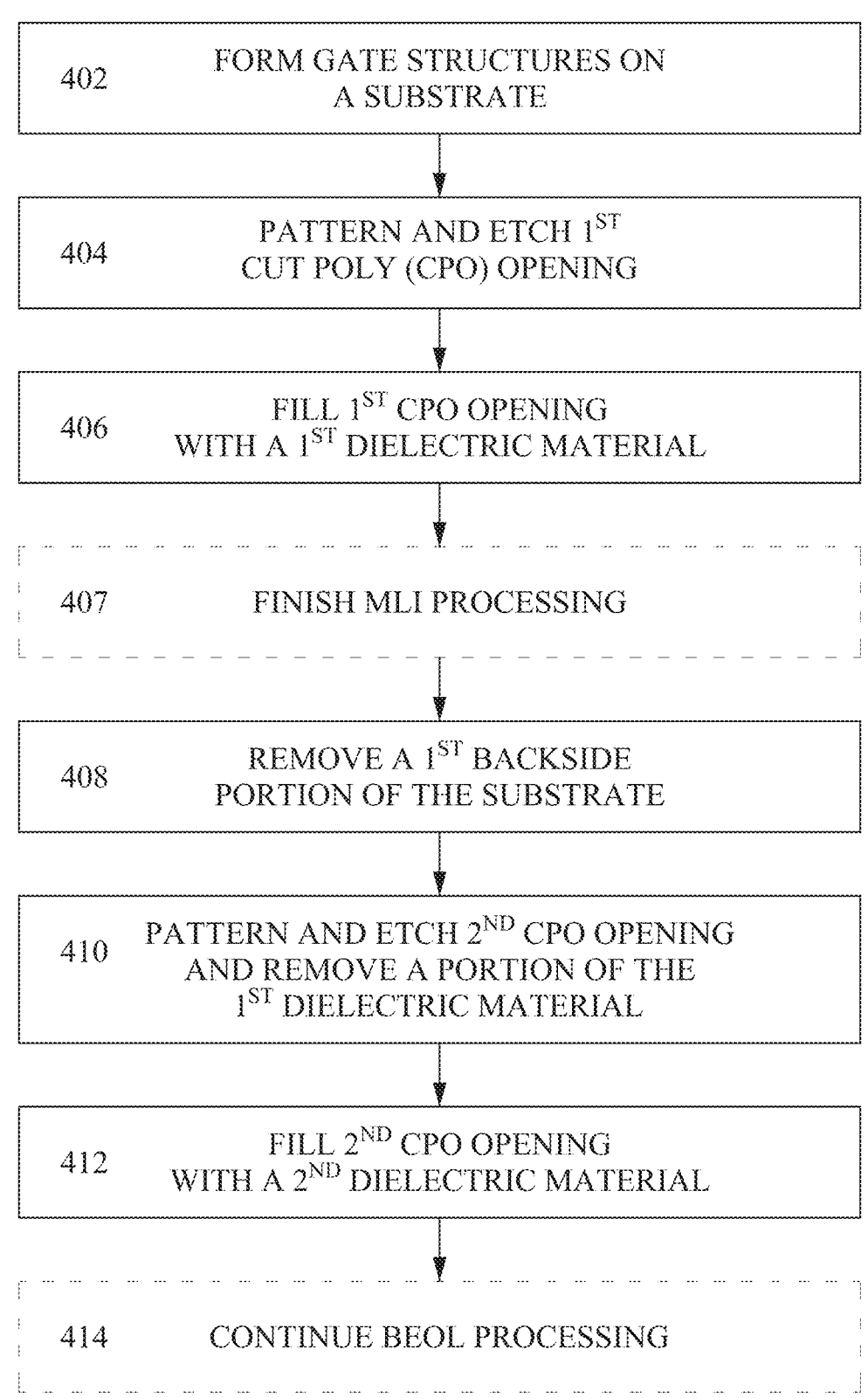

402    FORM GATE STRUCTURES ON A SUBSTRATE

404    PATTERN AND ETCH 1$^{ST}$ CUT POLY (CPO) OPENING

406    FILL 1$^{ST}$ CPO OPENING WITH A 1$^{ST}$ DIELECTRIC MATERIAL

407    FINISH MLI PROCESSING

408    REMOVE A 1$^{ST}$ BACKSIDE PORTION OF THE SUBSTRATE

410    PATTERN AND ETCH 2$^{ND}$ CPO OPENING AND REMOVE A PORTION OF THE 1$^{ST}$ DIELECTRIC MATERIAL

412    FILL 2$^{ND}$ CPO OPENING WITH A 2$^{ND}$ DIELECTRIC MATERIAL

414    CONTINUE BEOL PROCESSING

FIG. 4B

HYBRID CUT METAL GATE TO ACHIEVE MINIMUM CELL PITCHES, REDUCING ROUTING AND RISING THE YIELD

PRIORITY CLAIM

The present application claims the priority of U.S. Provisional Application No. 63/375,410, filed Sep. 13, 2022, which is incorporated herein by reference in its entirety.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers of material over a substrate, and patterning the various material layers using lithography to form circuit components and elements thereon. As the semiconductor industry has progressed into nanometer technology process nodes in pursuit of higher device density, higher performance, and lower costs, challenges from both fabrication and design issues have resulted in the development of a number of three-dimensional designs including, for example, Metal-Oxide-Silicon Field Effect Transistors (MOS-FET), Field Effect Transistors (FET), Fin Field Effect Transistor (Fin-FET), Nano-Sheet Field Effect Transistor, Nano-Wire Field Effect Transistor, and Gate-All-Around (GAA) devices.

Integrated circuit (IC) manufacturing is typically divided into front-end-of-line (FEOL) processing and back-end-of-line (BEOL) processing. FEOL processes generally encompass those processes related to fabricating functional elements, such as transistors and resistors, in or on a semiconductor substrate. For example, FEOL processes typically include forming isolation features, gate structures, and source and drain features (also referred to as source/drain or S/D features). BEOL processes generally encompass those processes related to fabricating a multilayer interconnect (MLI) feature that interconnects the functional IC elements and structures fabricated during FEOL processing to provide connection to and enable operation of the resulting IC devices. Process and structural modifications that reduce the process complexity and/or size of features associated with, for example, gate structures and multilayer interconnect structures, tend to reduce the overall size of the IC devices, improve cycle time, and/or improve yield and reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are flowcharts of manufacturing processes for the production of IC devices according to some embodiments.

DETAILED DESCRIPTION

Figure 1A:
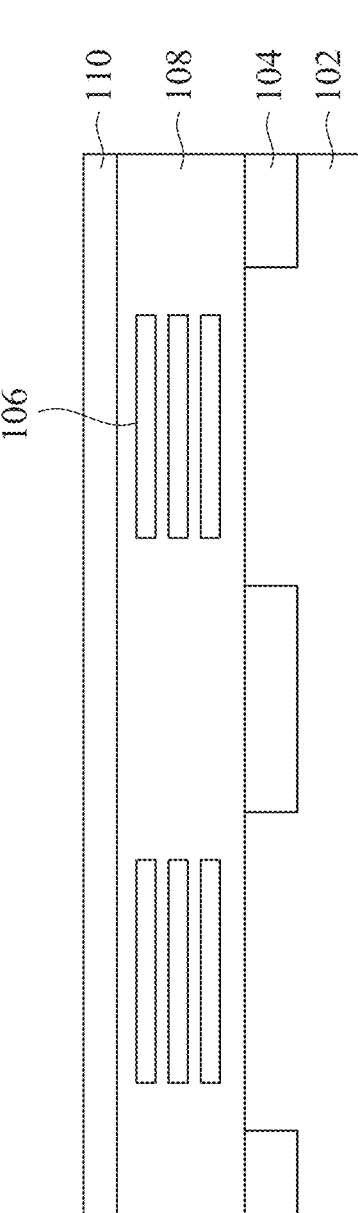
FIGS. 1A-1F are cross-sectional views of a semiconductor device during a manufacturing process, according to some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first are formed in direct contact the second features and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The structures and methods detailed below relate generally to the structures, designs, and manufacturing methods for IC devices include a multilevel interconnect (MLI) structure that, in some embodiments, allows for reduced sizing of functional elements by increasing the number of via positions available, eliminating the need for multi-pattern via formation, and/or reducing the number of conductive elements used for achieving a desired functionality. Although the structures and methods will be discussed in terms of field effect transistor (FET) and nano-sheet devices, the structures and methods are not so limited and are suitable for inclusion in manufacturing processes for other classes and configurations of IC devices including, without limitation, bulk semiconductor devices and silicon-on-insulator (SOI) devices, Metal-Oxide-Silicon Field Effect Transistors (MOSFET or FET), Fin Field Effect Transistor (FinFET), Nano-Sheet Field Effect Transistor, Nano-Wire Field Effect Transistor, and Gate-All-Around (GAA) devices.

In some embodiments, the manufacture of MLI features including contact, vias, and conductive lines are affected by underlying FEOL structures including, for example, gate structures that are modified using a cut polysilicon (CPO)

process for forming a gate isolation structure that separates a first portion of a gate structure from a second portion of the gate structure.

As feature areas continue to shrink, the physical alignment and sizing of successive layers and elements and maintaining the electrical isolation of separate elements represents significant challenges. In some embodiments, the relocation and/or resizing of one or more features provides spacing sufficient for the inclusion of additional conductive features, e.g., vias, that, in turn, reduces the need for additional conductive elements in one or more of the associated conductive patterns. In some embodiments, this reduction in the number of structures and the area used for effecting a functional element, e.g., an active area providing a polysilicon cross-connect function, provides improved yield and device lifetime. In some embodiments reducing the dimensions of functional elements increasing the associated processing challenges, e.g., ensuring the complete removal of residual material from a high-aspect ratio feature without undue overetching. In some embodiments, the issues relating to removing material during the formation of high-aspect ratio opening, e.g., a gate isolation opening, are overcome by adopting a two-stage or hybrid process. In some embodiments, a first gate isolation etch removes an upper portion of a gate structure and then, during a subsequent process, a lower portion of the gate structure is removed using a backside etch. In some embodiments, this combination of a first frontside etch and a subsequent backside etch are configured to ensure that the entire gate structure is removed during formation of the gate isolation structure.

FIG. 1A is a cross-sectional view of a cut polysilicon (CPO) operation useful in the manufacture of IC devices according to some embodiments. The IC device 100A in FIG. 1A includes a semiconductor substrate 102 in which substrate isolation structures 104 of one or more dielectric materials have been deposited or formed. In some embodiments, the semiconductor substrate 102 is patterned and etched to form recessed regions into which the dielectric material(s) is deposited using materials having a high dielectric constant (k value), e.g., $\kappa > 3.9$. In some embodiments, the high-k dielectric material includes one or more of $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, $SiO_xN_y$, and combinations thereof, or another suitable material. The insulating/dielectric materials may be formed by atomic layer deposition (ALD), physical vapor deposition (PVD), chemical vapor deposition CVD, plasma enhanced chemical vapor deposition (PECVD), thermal oxidation, self-aligned monolayer (SAM) deposition and/or one or more other suitable method(s).

The IC device 100A in FIG. 1A includes a series of nano-plates or nano-sheets 106 that are embedded in a gate structure 108 of a first conductive material. In some embodiments, the gate structure 108 includes a layer 110 of a second conductive material to reduce the overall resistivity of the gate structure 108. In some embodiments, the first and second conductive materials are selected from a group including, polysilicon, metals, metal alloys, and/or metal silicides. In some embodiments, the conductive material will include various combinations of materials to enhance the device performance and/or device longevity including, for example, a liner layer, a wetting layer, an adhesion layer, a metal fill layer, and/or one or more other suitable layers. In some embodiments, the conductive material will be selected from Si, Ti, Ag, Al, TiAlN, TaC, TaCN, TaSiN, Mn, Zr, TiN, TaN, Ru, Mo, Al, WN, Cu, W, Re, Jr, Co, Ni, and other conductive materials suitable for use in conjunction with polysilicon, and combinations and alloys thereof.

Figure 1B:
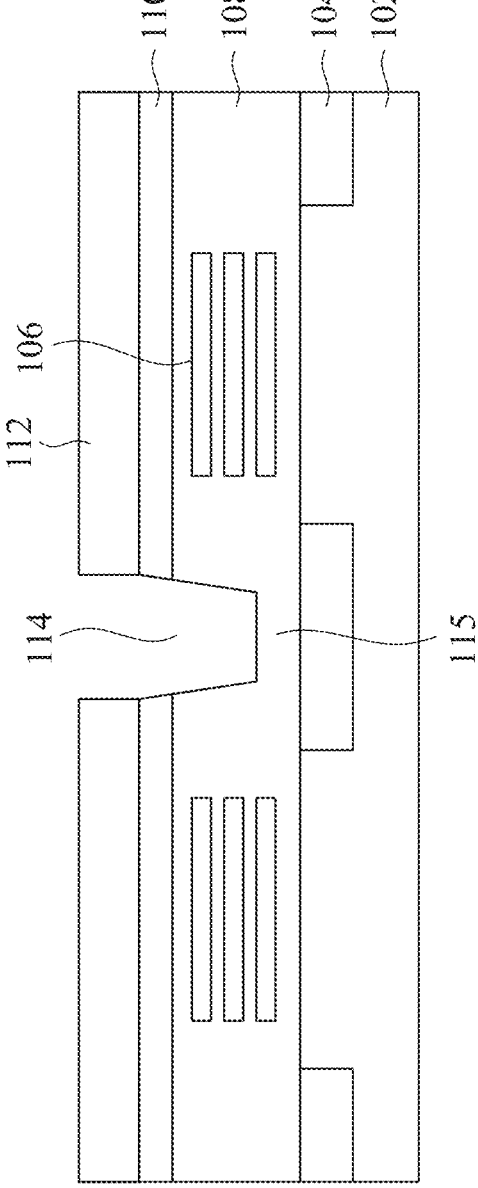

FIG. 1B is a cross-section view of the IC device 100B after completion of a pattern-etch process in which a first isolation etch pattern 112 is formed on the IC device using one or more photolithography processes including, for example, double-patterning or multi-patterning processes using one or more photoresist combinations to allow for resolution of patterns that have, for example, a feature pitch smaller than what could be obtained using a single, direct photolithography process. First isolation etch pattern 112 is characterized as a "cut" pattern that, in combination with a main gate pattern (not shown) removes portions of the gate structures formed using the main pattern to achieve a desired target pattern, e.g., a pattern that allows for the formation of a gate isolation structure to separate two portions of the gate structure. Using this combination of main pattern and a cut pattern provides certain advantages during the photolithographic process including, for example, increasing the lithographic process window, i.e., providing for a wider range of focus and exposure settings that will still produce the desired features in a photoresist layer.

After the isolation etch pattern 112 has been applied to the gate structure 108, 110 to define an opening that exposes the portion of the gate structure that will be removed, a first thickness of the exposed portion of the gate structure is removed by etching to form a first gate isolation recess 114. In some embodiments, the etch process does not remove the full thickness of the gate structure 108 so that the IC device includes a residual portion 115 of the gate structure. In some embodiments, the etch process is performed using plasma etching, reactive ion etching (RIE), or a liquid chemical etch solution. In some embodiments a liquid chemical etch solution will include one or more etchants such as citric acid $(C_6H_8O_7)$, hydrogen peroxide $(H_2O_2)$, nitric acid $(HNO_3)$, sulfuric acid $(H_2SO_4)$, hydrochloric acid (HCl), acetic acid $(CH_3CO_2H)$, hydrofluoric acid (HF), buffered hydrofluoric acid (BHF), phosphoric acid $(H_3PO_4)$, ammonium fluoride $(NH_4F)$ potassium hydroxide (KOH), ethylenediamine pyrocatechol (EDP), TMAH (tetramethylammonium hydroxide), or a combination thereof.

In some embodiments, the etching process is a dry-etch or plasma etch process performed using halogen-containing reactive gases excited by an electromagnetic field to dissociate into ions that are then accelerated toward the material being etched. Reactive or etchant gases include, for example, $CF_4$, $SF_6$, $NF_3$, $Cl_2$, $CCl_2F_2$, $SiCl_4$, $BCl_2$, and combinations thereof, although other semiconductor-material etchant gases are also envisioned within the scope of the present disclosure.

Figure 1C:
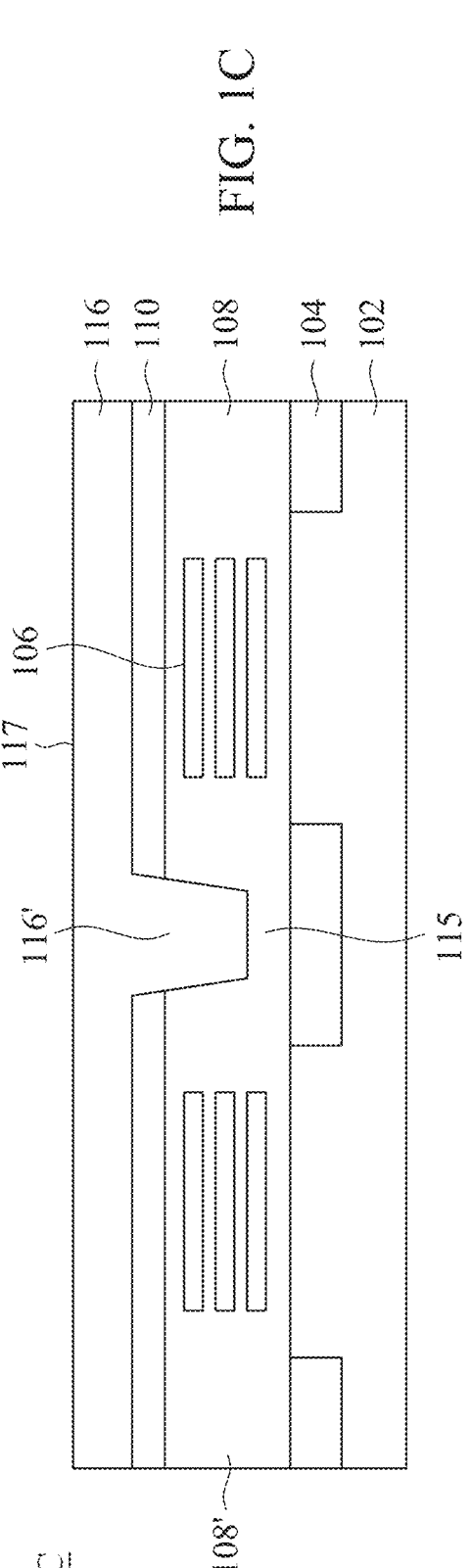

FIG. 1C is a cross-section view of the IC device 100C after the isolation pattern etch has been completed, the isolation etch pattern 112 has been removed from the gate structure 108, 110, and a first thickness of a first dielectric material 116 has been deposited on the surface of the IC device to a thickness sufficient to fill the first gate isolation recess 114 and form a first part of a gate isolation structure 116'. In some embodiments, the first dielectric material will include materials having a high dielectric constant (k value), e.g., $\kappa > 3.9$. In some embodiments, the high-k dielectric material includes one or more of $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, $SiO_xN_y$, and combinations thereof, or another suitable material. The high-k dielectric materials may be formed by ALD, physical vapor deposition (PVD), chemical vapor deposition CVD, plasma enhanced chemical vapor deposition (PECVD), thermal oxidation, and/or one or more other suitable method(s).

In some embodiments the thickness of the first dielectric material 116 is sufficient to fill the first gate isolation recess 114 and form a layer on the remaining portions of the gate structure. In some embodiments, the first dielectric material 116 comprises a series of layers (not shown) of dielectric material(s). In some embodiments the first dielectric material is then planarized to remove an upper portion of the first dielectric material thickness to expose a portion of the gate structure removed by, for example, chemical-mechanical polishing (CMP) or an etchback process, to provide a more planar surface 117 for subsequent multilevel interconnect processing. CMP processes utilize the action of a polishing pad in combination with an abrasive slurry that are applied to a surface of an IC device using a polishing machine for removing upper portions of different material layers. In some embodiments, the particular combination of the CMP polishing pad and slurry are selected based on factors including the material(s) being removed, e.g., silicon dioxide, polysilicon, or single crystal silicon, the technical performance requirement(s), process optimization, and/or cost-of-ownership considerations. In an etchback process, an IC device surface is exposed to one or more dry etch processes to remove a portion of an upper layer of material and thereby improve the planarity of the IC device surface. In some embodiments, the etchant gases used in the etchback process include a combination of $CF_4$, $CHF_3$, Ar, and $O_2$ and are applied under varying levels of gas flow and RF power depending on the material(s) being etched and the stage of the etchback process.

Figure 1D:
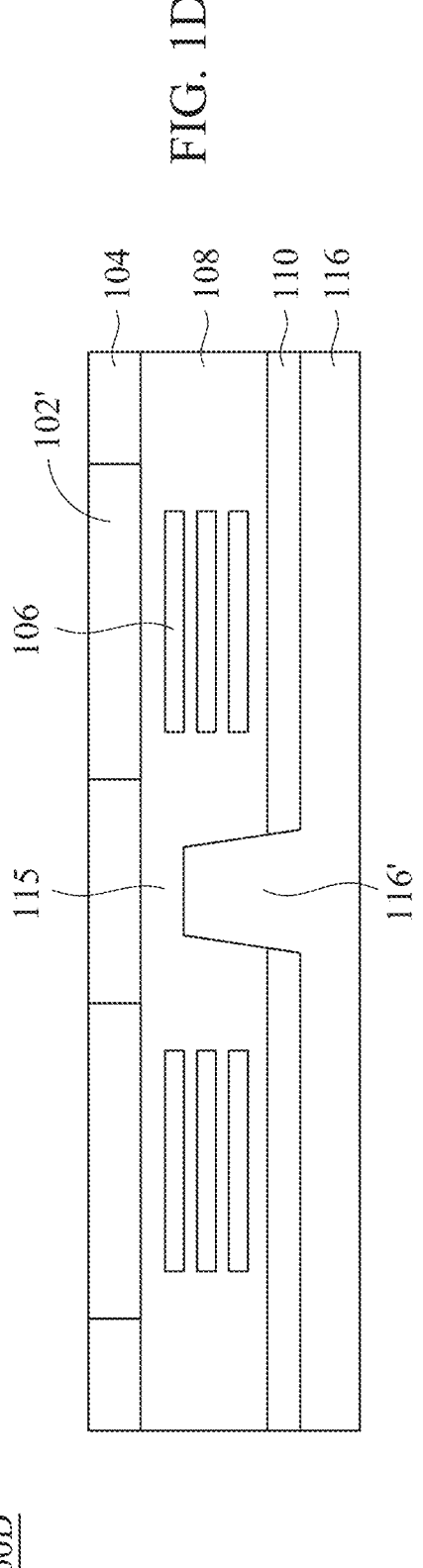

FIG. 1D is a cross-section view of the IC device 100D after the IC device has been inverted for backside processing and a lower portion of the semiconductor substrate 102 has been removed to form a planar surface exposing lower surfaces of both the residual portions of the semiconductor substrate 102' and substrate isolation structures 104. In some embodiments the semiconductor substrate is removed using a grinding process using an abrasive pad, an etchback process, and/or a CMP process using a combination of a polishing pad and a slurry. In some embodiments, the process of removing the lower portion of the semiconductor substrate is a multi-stage process in which an initial removal operation is configured for more rapid removal of the semiconductor material and a second removal operation is configured for a slower and more selective removal of the semiconductor material. In some embodiments, the second removal operation is configured whereby exposing lower surfaces of the substrate isolation structures 104 defines an endpoint for the second removal operation. In some embodiments, the process of removing the lower portion of the semiconductor substrate is a single-stage process in which the initial process parameters are configured for more rapid removal of the semiconductor material with the final process parameters being configured for a slower and more selective removal of the semiconductor material in order to reduce overetching or excessive removal of material from the lower surface of the IC device.

Figure 1E:
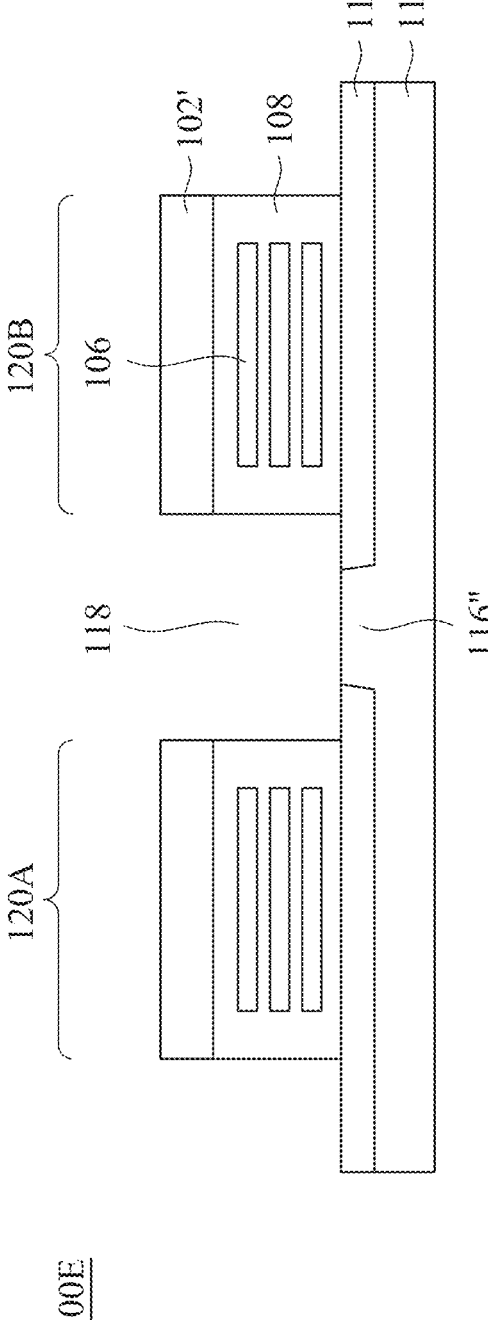

FIG. 1E is a cross-section view of the inverted IC device 100E after the substrate isolation structures 104 and a residual portion 115 of gate structure 108 has been etched or otherwise removed in a second gate isolation etch operation to form a second gate isolation opening 118 and thereby complete the "cut" of the gate structure that originally extended across both a first transistor 120A and a second transistor 120B, thereby isolating the first and second transistors for use in different conductive networks (net or nets).

Figure 1F:
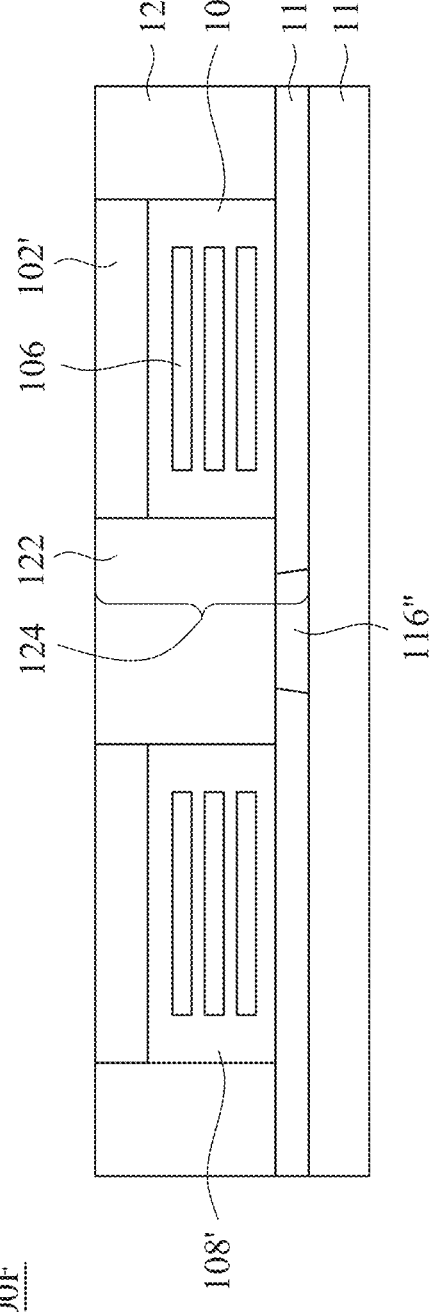

FIG. 1F is a cross-section view of the inverted IC device 100F after a second dielectric layer 122 is deposited. In some embodiments, the second dielectric layer 122 is deposited on the etched backside of the semiconductor device and planarized to form a planar surface and complete gate isolation structure 124. In some embodiments, the second dielectric layer 122 is planarized using a CMP and/or etchback process to expose lower surfaces of both the residual portions of the semiconductor substrate 102' adjacent the second dielectric layer 122.

As reflected in the series of process operations shown in FIGS. 1A-1F, the combination of the first isolation etch operation, which removes an upper portion of the gate structure 108, and the second isolation etch operation, which removes a lower portion residual portion 115 of the gate structure 108 and, in some embodiments, an additional portion of the first dielectric material that comprised a first part of a gate isolation structure 116' and leaving a residual portion 116" of the first dielectric material 116 to complete the gate isolation structure 124. In some embodiments this two-stage or hybrid formation of the cut polysilicon structure reduces the likelihood that any portion of the gate structure 108 will remain in the completed gate isolation structure. This improved and more consistent removal of any residual portion of the gate structure 108, thereby reduces the likelihood of failures associated with residual gate material and tends to improve the performance and/or lifetime of the resulting IC devices.

Figure 2A:
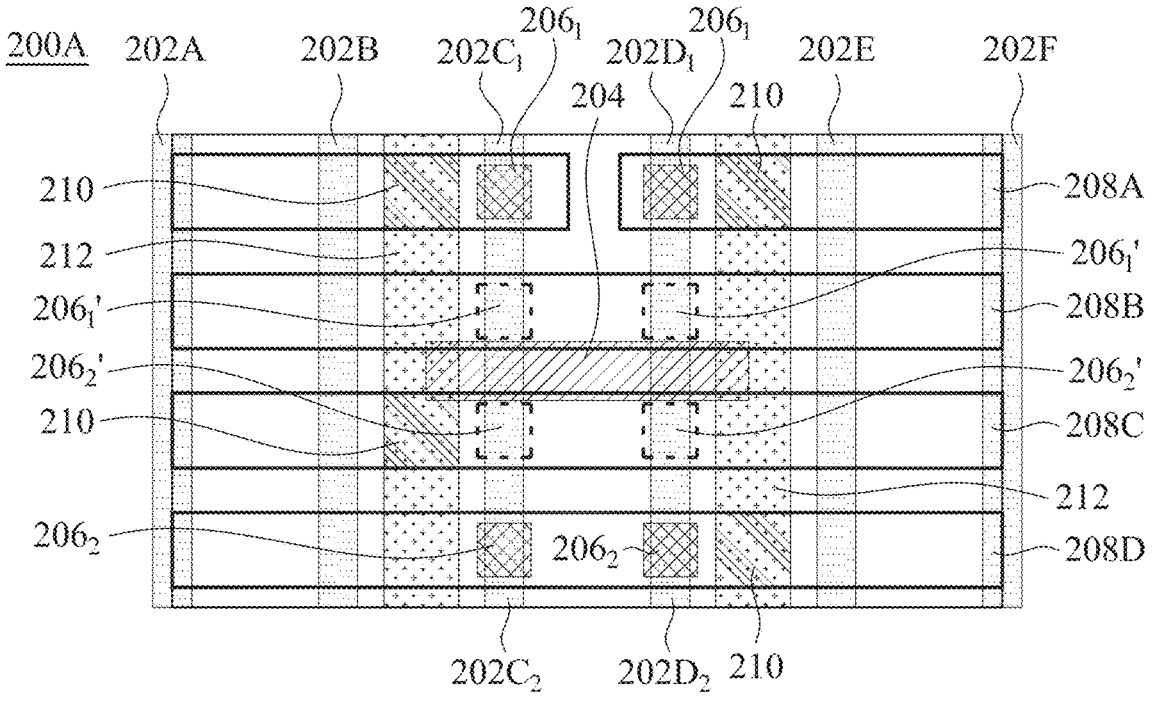
FIGS. 2A and 2B are plan views of a semiconductor device layout during a manufacturing process in accordance with some embodiments.

FIG. 2A is a plan view of a semiconductor device layout in accordance with some embodiments. The semiconductor device layout 200A in FIG. 2A includes a plurality of gate structures, 202A-F, a gate cut feature 204 that separates the conductive structures into a first conductive network (or first net) and a second conductive network (or second net) on opposite sides of the gate cut feature 204, a pair of gate vias (VG) $206_1$ associated with the first net and a pair of gate vias (VG) $206_2$ associated with the second net, an array of first conductive elements, e.g., metal level zero or M0, 208A-D extending across the gate structures with conductive elements 208A-B arranged above the gate cut feature 204 and conductive elements 208C-D arranged below the gate cut feature 204, with the conductive elements contacting the gate structures through the gate vias. The gate cut feature 204 is a dummy structure that is not present in a final device structure. The gate cut feature 204 indicates a location and a size of an opening to be formed in the corresponding gate structures 202A-F. In some embodiments, the location and size of the gate cut feature 204 is determined using the operations discussed in connection with FIGS. 1A-F. The semiconductor device in FIG. 2A also includes a number of M0 vias (V0) and an array of second conductive elements, e.g., metal level one or M1, 212 extending between and parallel to certain of the gate structures 202B-C and 202D-E and contacting at least some of the M0 conductive elements 208A-D through the M0 vias.

In some embodiments according to the layout of FIG. 2A the placement of the gate cut feature 204 between the first conductive elements 208B and 208C and the associated removal of portions of the gate structures precludes placement of gate vias at locations $206_1'$ and $206_2'$ adjacent the gate cut feature 204 and thereby preventing contact between the first conductive elements 208B and 208C and the underlying gate structures $202C_1$, $202D_1$, $202C_2$, and $202D_2$. In some embodiments this preclusion is a result of an insufficient length of or total absence of a polysilicon endcap structure between the gate via and a terminal portion of the residual portions of the gate structures $202C_1$, $202D_1$, $202C_2$, and $202D_2$ is below a minimum spacing set by a design rule applicable to the manufacturing process or process node being utilized and the corresponding design parameters for semiconductor devices being manufactured within the designated process node.

Although the configuration of the layout of FIG. 2A is acceptable for some configurations of the transistors in some embodiments, in other configurations of the transistors, e.g., a cross-connected arrangement between gate structures in the first net and gate structures in the second net, an ability to contact at least one of the medial first conductive elements 208B and 208C is advantageous in some embodiments.

Figure 2B:
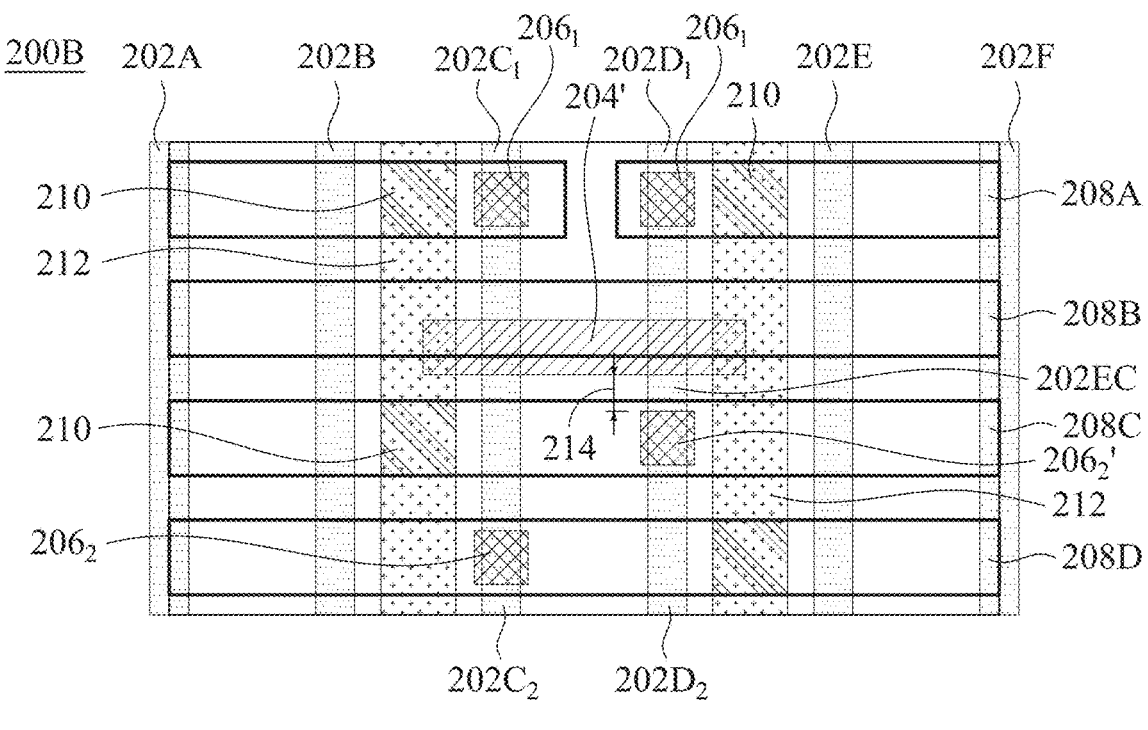

FIG. 2B is a plan view of a semiconductor device layout 200B in accordance with some embodiments in which the positioning of the gate cut feature 204' has been modified from that shown in the embodiment of FIG. 2A. In embodiments according to FIG. 2B, the positioning of the gate cut feature 204' is offset relative to the array of first conductive elements, specifically by being shifted away from first conductive element 208C so that the gate cut feature 204' is positioned at least partially overlapped with the medial first conductive element 208B and the spacing between the gate cut feature 204' and first medial conductive element 208C is increased. In some embodiments, a major portion of the gate cut feature 204' is overlapped with the first conductive element 208B while in other embodiments (not shown) the gate cut feature 204' is positioned completely overlapped with the first conductive element 208B.

In some embodiments according to the layout of FIG. 2B this shift in the location of gate isolation structure 204' away from one of the medial first conductive structure 208C increases the length 214 of the residual portion of the gate structure $202D_2$ remaining gate cut feature 204' is overlapped with the first conductive element 208B and forms an enlarged polysilicon endcap 202EC. In some embodiments, the length of the enlarged polysilicon endcap 202EC meets or exceeds the minimum spacing set by the design rules applicable to the manufacturing process or process node being utilized. In such embodiments an additional gate via structure $206_2$' is able to be utilized to provide an electrical connection between the gate structure $202D_2$ and the first conductive element 208C. These embodiments, by providing access to adjacent gate structures $202C_1$, $202D_1$, $202C_2$, and $202D_2$ by three of the four first conductive elements 208A, 208C, and 208D reduces the number of elements used in forming a functional element, e.g., a cross-connected gate configuration, thereby reducing the size of the resulting semiconductor device and decreasing the risk of defects within the functional element.

Figure 3A:
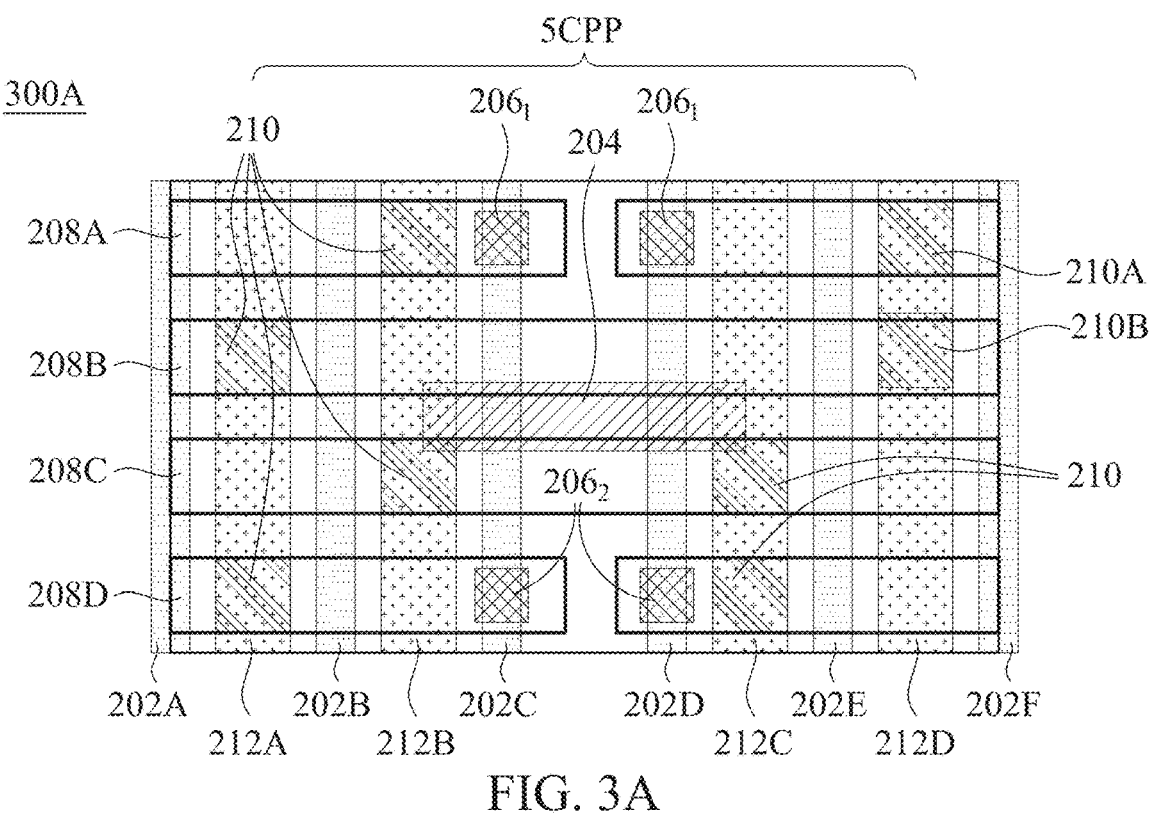
FIGS. 3A and 3B are plan views of a semiconductor device layout during a manufacturing process in accordance with some embodiments.

FIG. 3A is a plan view of a semiconductor device layout 300A in accordance with some embodiments. The semiconductor device layout 300A in FIG. 3A includes a plurality of gate structures, 202A-F, a gate cut feature 204 that separates the conductive structures into a first conductive network (or first net) and a second conductive network (or second net) on opposite sides of the gate isolation structure 204, a pair of gate vias (VG) $206_1$ associated with the first net and a pair of gate vias (VG) $206_2$ associated with the second net, an array of first conductive elements, e.g., metal level zero or M0, 208A-D extending across the gate structures with conductive elements 208A-B arranged above the gate isolation structure 204 and conductive elements 208C-D overlapping with the gate cut feature 204, with the conductive elements contacting the gate structures through the gate vias.

In some embodiments a position of the gate cut feature 204 will result in the manufacturing operations discussed in connection with FIGS. 1A-F to separate adjacent gate structures 202A-F.

The semiconductor device layout in FIG. 3A also includes a number of M0 vias (V0) 210 and an array of second conductive elements, e.g., metal level one or M1, 212A-D extending between and parallel to certain of the gate structures 202A-B, 202B-C, 202D-E, and 202E-F and contacting at least some of the M0 conductive elements 208A-D through the M0 vias 210. In embodiments in which the gate cut feature 204 is not shifted to provide adequate spacing for an additional gate contact between, e.g., first conductive element 208C and gate structure 202D, additional second conductive elements 212A and 212D, connected to the first conductive elements 208A-D through M0 vias 210, are utilized as an alternative means for providing polysilicon cross-connect functionality. The inclusion of the additional second conductive elements 212A and 212D increase the width of the functional cell to 5 contacted poly pitches (5 CPP).

In some embodiments according to the semiconductor device layout of FIG. 3A that utilize the additional second conductive elements 212A and 212D, the spacing between two or more of the M0 vias 210, e.g., 210A and 210B, is not sufficient to satisfy the relevant design rules relating to minimum via spacing distances and/or may compromise the related photolithographic or etch operations. In such embodiments in which adjacent M0 vias have a higher risk of not being imaged properly using a single mask, at least the adjacent M0 via 210 is provided on a second M0 via mask. In some embodiments each of the two M0 via masks patterns similar numbers of M0 vias. Although in some embodiments this dual mask approach provides suitable patterning and/or etching performance, the approach still complicates and prolongs the manufacturing process for the semiconductor devices. In some embodiments, achieving the polysilicon cross-connect or other desired functionality is achieved with, for example, the simplified circuit configurations shown in FIGS. 2B and 3B in which the width of a functional portion of the cell has a width of 3 CPP, resulting in a decrease in cell area the order of 40%, thereby tending to increase the yield for a given defect density.

Figure 3B:
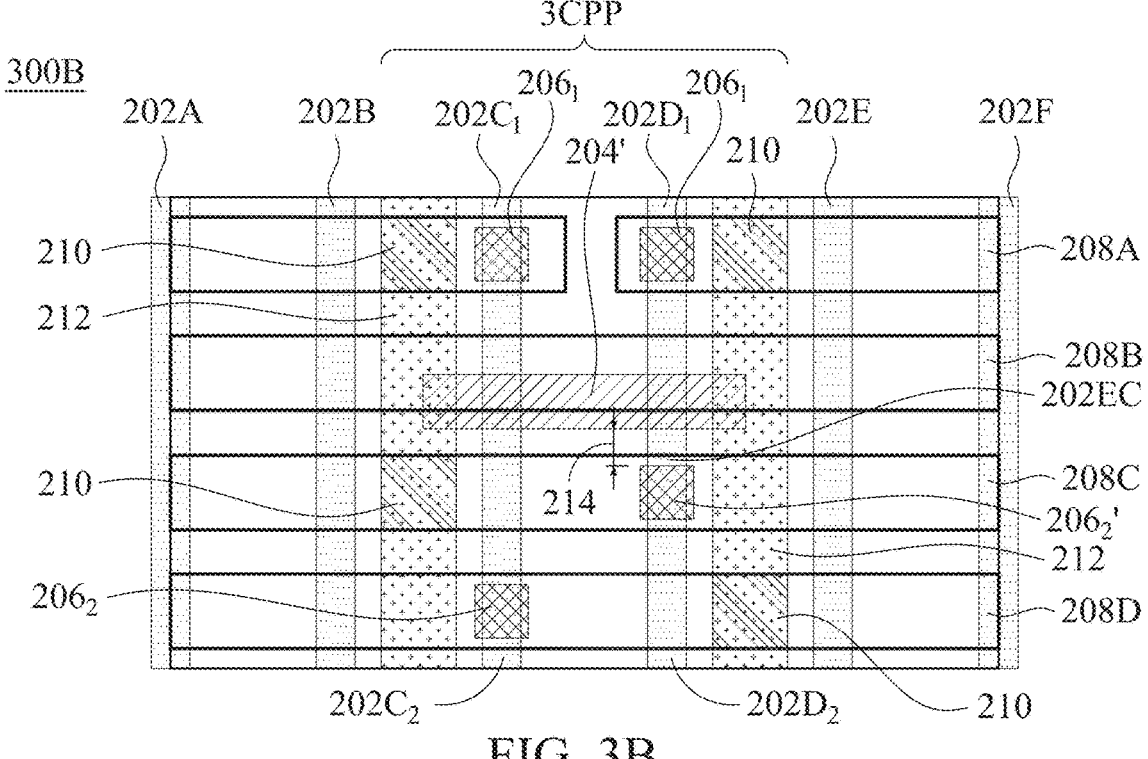

In some embodiments of a semiconductor device layout 300B according to FIG. 3B the location of gate cut feature 204' is shifted away from first conductive structure 208C and thereby increasing the length 214 of the residual portion of the gate structure $202D_2$ remaining at a terminal portion of polysilicon structure $202D_2$ and forming an enlarged gate endcap 202EC. In some embodiments, the length of the enlarged endcap 202EC meets or exceeds the minimum spacing set by the design rules applicable to the manufacturing process or process node being utilized. In such embodiments an additional gate via structure $206_2$' can be utilized to provide an electrical connection between the gate structure $202D_2$ and the first conductive element 208C. These embodiments, by providing access to adjacent gate structures $202C_1$, $202D_1$, $202C_2$, and $202D_2$ by three of the four first conductive elements 208A, 208C, and 208D reduces the number of elements used in forming a functional element, e.g., a cross-connected gate configuration, thereby reducing the size of the resulting semiconductor device and decreasing the risk of defects within the functional element.

In some embodiments, semiconductor device layouts according to FIG. 3B are used for manufacturing corresponding semiconductor devices by utilizing embodiments of the methods of manufacturing a semiconductor device according to FIGS. 1A-F, the hybrid method of forming the gate isolation structure 124 improves the removal of the gate electrode 108 material from high-aspect ratio openings, thereby allowing the width of the gate isolation structure to be reduced. In some embodiments, this reduction of the gate isolation structure and/or a shift in the position of the gate isolation structure relative to the first conductive elements 208A-D (M0) improves the design flexibility regarding placement of an additional gate via 206₂' on one of the medial first conductive elements 208B, 208D (placement on 208D not shown), thereby reducing the need for routing within the cell for achieving certain desired IC device functionality. In embodiments of semiconductor device layout 300B corresponding to FIG. 3B, a desired functionality is achieved with only two of the second conductive elements 212 used in FIG. 3A, removes the spacing restriction for the additional M0 vias being formed on the eliminated second conductive elements, removes the associated utilization of a two-stage lithographic process for forming adjacent M0 vias. Embodiments of IC devices according to FIG. 3B utilize 3 of the 4 first conductive elements 208A, 208C, 208D (M0) and reduce the number of second conductive elements from 4 to 2, thereby reducing the device are, increasing the processing yield, and improving IC device lifetime.

Figure 4A:
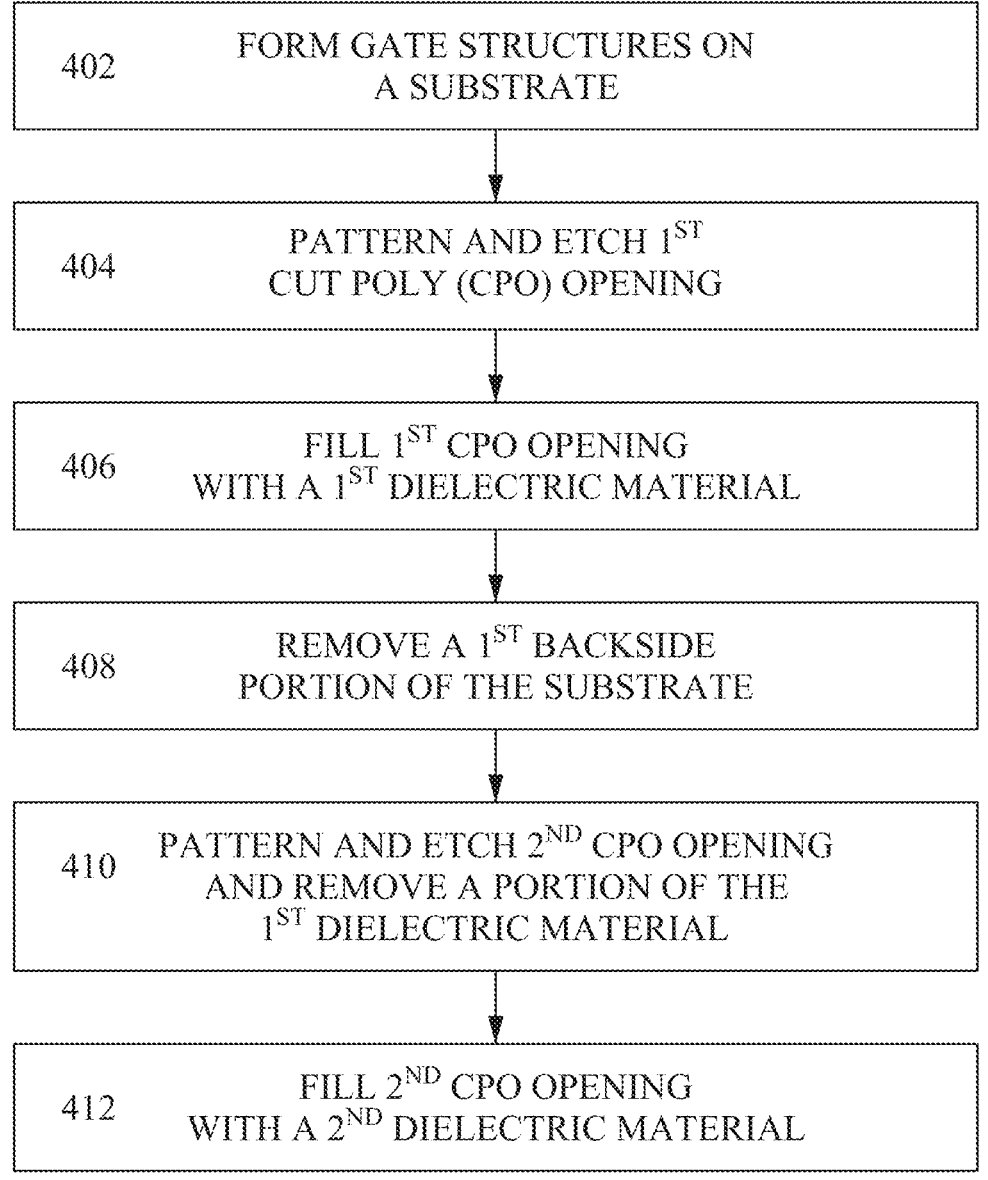

FIG. 4A is a flowchart of a manufacturing process 400A for the production of IC devices according to some embodiments. In some embodiments, manufacturing process 400A are used to manufacture an IC device according to FIGS. 1A-F and references to the structures identified above in connection with FIGS. 1A-F are incorporated below to aid in the understanding the flowchart of FIG. 4A and not by way of limiting the application of the manufacturing process 400A to only the embodiments of FIGS. 1A-F. Embodiments according to FIG. 4A include operation 402 during which the substrate, e.g., a semiconductor substrate 102, is prepared and certain FEOL operations are completed to manufacture, for example, isolation structures, e.g., shallow trench isolation (STI) structures 104, wells, source/drain regions (not shown), channel regions (not shown), and gate electrodes (108, 110). In some embodiments the final layer or layers of material applied to the surface of the substrate is/are planarized using an etchback and/or CMP process to prepare the surface for subsequent processing. Details regarding the execution of processes utilized in performing operation 402 are detailed above in connection with the discussion of FIG. 1A according to some embodiments.

In operation 404 the planarized semiconductor substrate is patterned and exposed with a gate isolation pattern 112 to expose predetermined portions of the surface of the semiconductor device. In some embodiments an exposure energy from a radiation beam, such as an electron beam, ultraviolet (UV) beam or an extreme ultraviolet (EUV) beam is applied to a radiation sensitive material. The exposed materials are then developed to obtain a pattern of one or more residual materials selected for a desired level of performance under the process conditions. Using the exposed mask or, in some embodiments a "hard" mask, e.g., silicon dioxide (SiO₂), silicon nitride (Si₃N₄), silicon oxynitride (SiOₓNᵧ) or other suitable materials and combinations thereof and/or a "soft" mask, e.g., a polymeric coating of photoresist or polyimide, a first etch mask a first portion of the gate electrode 108, 110, is removed via etching to form a first gate isolation opening 114. In some embodiments, after the etching operation is complete the mask pattern material(s) are removed from the substrate and/or planarized before initiating subsequent operations. Details regarding the execution of processes utilized in performing operation 402 are detailed above in connection with the discussion of FIG. 1B according to some embodiments.

In operation 406 one or more dielectric materials "is/are deposited on the semiconductor device to fill the first gate isolation opening 114 to isolate or, depending on the depth of the gate isolation gate isolation opening, partially isolate a first portion of the gate structure 108 from a second portion of the gate structure 108'. Details regarding the execution of processes utilized in performing operation 406 are detailed above in connection with the discussion of FIG. 1C according to some embodiments.

In operation 408 a backside portion of the semiconductor substrate is removed in order to thin the wafer using CMP or another suitable process to a degree sufficient to expose backside surfaces of the substrate 102 between the STI structures 104. In some embodiments the backside processing of the semiconductor substrate occurs only after a final multilayer interconnect (MLI) structure has been formed during BEOL processing. Details regarding the execution of processes utilized in performing operation 408 are detailed above in connection with the discussion of FIG. 1D according to some embodiments.

In operation 410 residual portions of the semiconductor substrate and/or a backside gate isolation pattern (not shown) formed on the backside of the thinned semiconductor wafer, are used to define the regions in which material is to be removed during a subsequent gate isolation etch operation. The backside surface of the semiconductor substrate is then etched to remove material 108, 116' from below the filled first gate isolation opening to form a second gate isolation opening that extends to at least a lower surface of the first dielectric material 116' that was deposited in the first gate isolation opening 114. In some embodiments a majority of the first dielectric material 116' is removed and in other embodiments the second gate isolation opening extends to a lower surface of the second layer of conductive material 110 applied over the gate structure. By extending the backside etch process to ensure that the second gate isolation opening 118 extends into the first dielectric material 116', embodiments of the method 400A help to ensure that any residual portion of the gate structure 108 is removed. Embodiments of methods incorporating this method for improving the removal of the gate structure 108 from the gate isolation structure 124 (204 in FIGS. 3A and 3B) from even higher-aspect ratio openings allows for the resizing and/or repositioning of the gate isolation structure within a cell of the semiconductor device. In some embodiments, this ability to resize and/or relocate the gate isolation structure increases the number of gate vias 206 used in the cell, reduces the number of conductive elements 212, and simplifies the manufacturing process. Details regarding the execution of processes utilized in performing operation 410 are detailed above in connection with the discussion of FIGS. 1E, 2B, and 3B according to some embodiments.

In operation 412 a second dielectric material is used to fill the second gate isolation opening to complete the gate isolation structure and separate the first and second portions of the gate structure. Because some embodiments of the semiconductor device include a second gate isolation opening that extends to at least a lower surface of the first dielectric material, the two-phase or hybrid gate isolation structure obtained by manufacturing process 400A removes any residual gate material from the gate isolation structure. Ensuring that any residual portion of the gate structure remaining after the first gate isolation etch is removed during the second gate isolation etch process reduces the likelihood of shorts and/or parasitic leakage that compromises the yield and/or the performance of the resulting semiconductor devices. Details regarding the execution of processes utilized in performing operation 412 are detailed above in connection with the discussion of FIG. 1F according to some embodiments.

Figure 5:
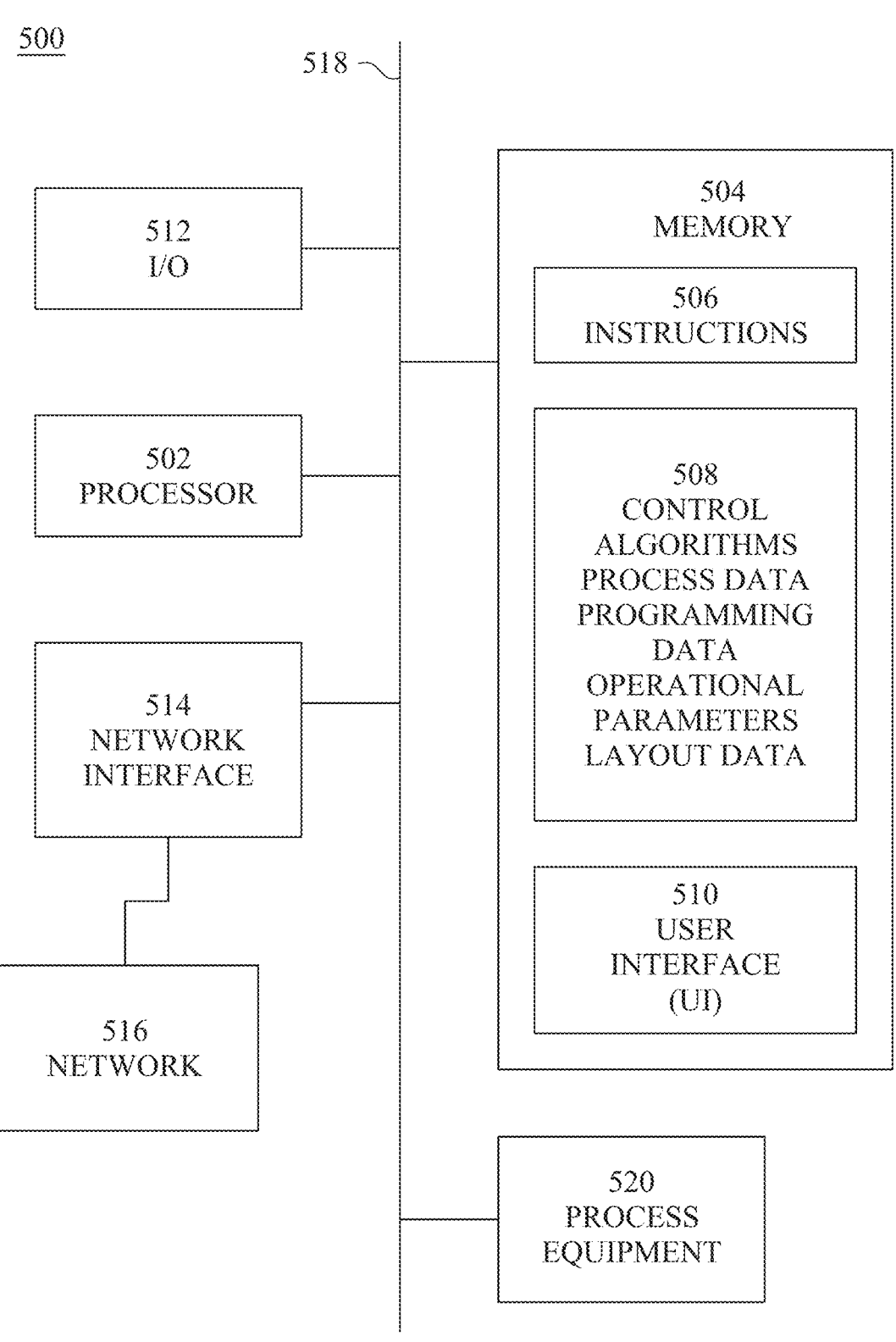
FIG. 5 is a schematic diagram of a system for manufacturing FET devices according to some embodiments.

FIG. 4B is a flowchart of a manufacturing process 400B for the production of IC devices according to some embodiments. In some respects, embodiments of the process according to FIG. 4B including certain of the operations detailed above in connection with FIG. 4A and FIGS. 1A-F. FIG. 4B also includes optional operation 407 during which additional layers of metal, vias, and intermetal dielectric (IMD) layers are provided on the semiconductor device to complete a multilayer interconnection structure (MLI) before proceeding to the backside processing of operations 408, 410, and 412 as detailed above in connection with the discussion of FIG. 4A and FIGS. 1D-F. Embodiments of the manufacturing process 400B that defer the backside processing until later in the BEOL processing simplify the handling of the semiconductor substrate by maintaining the original structural strength and avoiding the need for any special handling techniques and/or equipment. Other embodiments of the manufacturing process 400B include additional BEOL processing in operation 414 after the backside processing of operations have been completed and include one or more operations of testing, dicing, picking, and packaging utilized in manufacturing a completed and useable semiconductor device. FIG. 5 is a block diagram of an electronic process control (EPC) system 500, in accordance with some embodiments. Methods used for generating cell layout diagrams corresponding to some embodiments of the FET device structures detailed above, particularly with respect to the addition and placement of the electrical contacts, thermal contacts, active metal patterns, dummy metal patterns, and other heat dissipating structures may be implemented, for example, using EPC system 500, in accordance with some embodiments of such systems.

In some embodiments, EPC system 500 is a general purpose computing device including a hardware processor 502 and a non-transitory, computer-readable, storage medium 504. Computer-readable storage medium 504, amongst other things, is encoded with, i.e., stores, computer program code (or instructions) 506, i.e., a set of executable instructions. Execution of computer program code 506 by hardware processor 502 represents (at least in part) an EPC tool which implements a portion or all of, e.g., the methods described herein in accordance with one or more (hereinafter, the noted processes and/or methods).

Hardware processor 502 is electrically coupled to computer-readable storage medium 504 via a bus 518. Hardware processor 502 is also electrically coupled to an I/O interface 512 by bus 518. A network interface 514 is also electrically connected to hardware processor 502 via bus 518. Network interface 514 is connected to a network 516, so that hardware processor 502 and computer-readable storage medium 504 are capable of connecting to external elements via network 516. Hardware processor 502 is configured to execute computer program code 506 encoded in computer-readable storage medium 504 in order to cause the EPC system 500 to be usable for performing a portion or all of the noted processes and/or methods. In one or more embodiments, hardware processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

In one or more embodiments, computer-readable storage medium 504 stores computer program code 506 configured to cause the EPC system 500 (where such execution represents (at least in part) the EPC tool) to be usable for performing a portion or all of the noted processes and/or methods. In one or more embodiments, computer-readable storage medium 504 also stores information which facilitates performing a portion or all of the noted processes and/or methods. In one or more embodiments, computer-readable storage medium 504 stores process control data 508 including, in some embodiments, control algorithms, process variables and constants, target ranges, set points, programming control data, and code for enabling statistical process control (SPC) and/or model predictive control (MPC) based control of the various processes.

EPC system 500 includes I/O interface 512. I/O interface 512 is coupled to external circuitry. In one or more embodiments, I/O interface 512 includes a keyboard, keypad, mouse, trackball, trackpad, touchscreen, and/or cursor direction keys for communicating information and commands to hardware processor 502.

EPC system 500 also includes network interface 514 coupled to hardware processor 502. Network interface 514 allows EPC system 500 to communicate with network 516, to which one or more other computer systems are connected. Network interface 514 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 500.

EPC system 500 is configured to send information to and receive information from fabrication tools 520 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 504.

EPC system 500 is configured to receive information through I/O interface 512. The information received through I/O interface 512 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 502. The information is transferred to hardware processor 502 via bus 518. EPC system 500 is configured to receive information related to a user interface (UI) through I/O interface 512. The information is stored in computer-readable medium 504 as user interface (UI) 510.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 500.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 6:
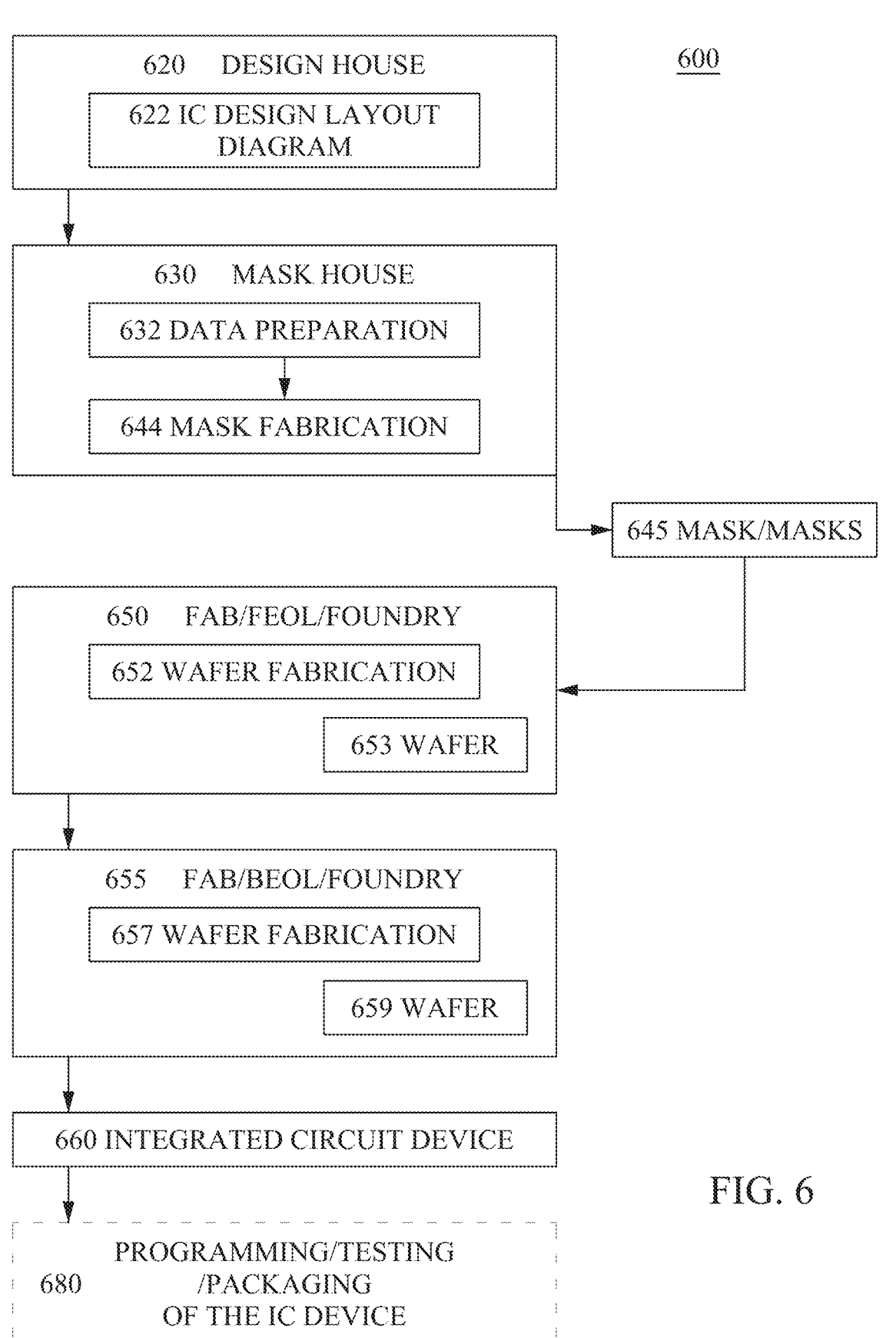
FIG. 6 is a flowchart of IC device design, manufacture, and programming of IC devices according to some embodiments.

FIG. 6 is a block diagram of an integrated circuit (IC) manufacturing system 600, and an IC manufacturing flow associated therewith, in accordance with some embodiments for manufacturing IC devices that incorporate the improved control over the SSD and EPI profile. In some embodiments, based on a layout diagram, at least one of (A) one or more semiconductor masks or (B) at least one component in a layer of a semiconductor integrated circuit is fabricated using manufacturing system 600.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. Once the manufacturing process has been completed to form a plurality of IC devices on a wafer, the wafer is optionally sent to backend or back end of line (BEOL) 680 for, depending on the device, programming, electrical testing, and packaging in order to obtain the final IC device products. The entities in manufacturing system 600 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 620, mask house 630, and IC Fab 650 is owned by a single larger company. In some embodiments, two or more of design house 620, mask house 630, and IC Fab 650 coexist in a common facility and use common resources.

Design house (or design team) 620 generates an IC design layout diagram 622. IC design layout diagram 622 includes various geometrical patterns designed for an IC device 660. The geometrical patterns correspond to patterns of metal, oxide, or semiconductor layers that make up the various components of IC device 660 to be fabricated. The various layers combine to form various IC features.

For example, a portion of IC design layout diagram 622 includes various IC features, such as an active region, gate electrode, source and drain, metal lines or vias of an inter-metal interconnection, and openings for bonding pads, to be formed in a semiconductor substrate (such as a silicon wafer) and various material layers disposed on the semiconductor substrate. Design house 620 implements a proper design procedure to form IC design layout diagram 622. The design procedure includes one or more of logic design, physical design or place and route. IC design layout diagram 622 is presented in one or more data files having information of the geometrical patterns. For example, IC design layout diagram 622, in some operations, will be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 630 includes mask data preparation 632 and mask fabrication 644. Mask house 630 uses IC design layout diagram 622 to manufacture one or more masks 645 to be used for fabricating the various layers of IC device 660 according to IC design layout diagram 622. Mask house 630 performs mask data preparation 632, where IC design layout diagram 622 is translated into a representative data file ("RDF"). Mask data preparation 632 provides the RDF to mask fabrication 644. Mask fabrication 644 includes a mask writer. A mask writer converts the RDF to an image on a substrate, such as a mask (reticle) 645 or a semiconductor wafer 653. The IC design layout diagram 622 is manipulated by mask data preparation 632 to comply with particular characteristics of the mask writer and/or requirements of IC Fab 650. In FIG. 6, mask data preparation 632 and mask fabrication 644 are illustrated as separate elements. In some embodiments, mask data preparation 632 and mask fabrication 644 are collectively referred to as mask data preparation.

In some embodiments, mask data preparation 632 includes optical proximity correction (OPC) which uses lithography enhancement techniques to compensate for image errors, such as those that are known to arise from diffraction, interference, other process effects and the like. OPC adjusts IC design layout diagram 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout diagram 622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 622 to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC Fab 650 to fabricate IC device 660. LPC simulates this processing based on IC design layout diagram 622 to create a simulated manufactured device, such as IC device 660. In some embodiments, the processing parameters in LPC simulation will include parameters associated with various processes of the IC manufacturing cycle, parameters associated with tools used for manufacturing the IC, and/or other aspects of the manufacturing process. LPC accounts for various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 622.

It should be understood that the above description of mask data preparation 632 has been simplified for the purposes of clarity. In some embodiments, mask data preparation 632 includes additional features such as a logic operation (LOP) to modify the IC design layout diagram 622 according to manufacturing rules. Additionally, the processes applied to IC design layout diagram 622 during mask data preparation 632 may be executed in a variety of different orders.

After mask data preparation 632 and during mask fabrication 644, a mask 645 or a group of masks 645 are fabricated based on the modified IC design layout diagram 622. In some embodiments, mask fabrication 644 includes performing one or more lithographic exposures based on IC design layout diagram 622. In some embodiments, an electron-beam (e-beam) or a mechanism of multiple e-beams is used to form a pattern on a mask (photomask or reticle) 645 based on the modified IC design layout diagram 622. Mask 645 will be formed using a process selected from various available technologies. In some embodiments, mask 645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 645 includes a transparent substrate (e.g., fused quartz) and an opaque material (e.g., chromium) coated in the opaque regions of the binary mask.

In another example, mask 645 is formed using a phase shift technology. In a phase shift mask (PSM) version of mask 645, various features in the pattern formed on the phase shift mask are configured to have proper phase difference to enhance the resolution and imaging quality. In various examples, the phase shift mask will be attenuated PSM or alternating PSM. The mask(s) generated by mask fabrication 644 is used in a variety of processes. For example, such a mask(s) is used in an ion implantation process to form various doped regions in semiconductor wafer 653, in an etching process to form various etching regions in semiconductor wafer 653, and/or in other suitable processes.

IC Fab 650 includes wafer fabrication 652. IC Fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 652 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 645 include a single layer of mask material. In some embodiments, a mask 645 includes multiple layers of mask materials.

In some embodiments IC Fab 655 includes wafer fabrication 657. IC Fab 655 is an IC fabrication business that includes one or more manufacturing facilities for the fabrication of a variety of different IC products. In some embodiments, IC Fab 655 is a manufacturing facility provide the back end fabrication for the interconnection and packaging of the IC products (back-end-of-line (BEOL) fabrication) to add one or more metallization layers to wafer 659, and a third manufacturing facility (not shown) may provide other services for the foundry business such as packaging and labelling.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

In some embodiments, etching processes include presenting the exposed structures in the functional area(s) to an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

Subsequent to mask patterning operations, areas not covered by the mask are etched to modify a dimension of one or more structures within the exposed area(s). In some embodiments, the etching is performed using plasma etching, reactive ion etching (RIE), or a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, molecular level processing technologies that share the self-limiting surface reaction characteristics utilized in ALD including, for example, Molecular Layer Deposition (MLD) and Self-Assembled Monolayers (SAM). MLD utilizes successive precursor-surface reactions in which a precursor is introduced into a reaction zone above the wafer surface. The precursor adsorbs to the wafer surface where it is confined by physisorption. The precursor then undergoes a quick chemisorption reaction with a number of active surface sites, leading to the self-limiting formation of molecular attachments in specific assemblies or regularly recurring structures. These MLD structures will be formed successfully using lower process temperatures than some traditional deposition techniques.

SAM is a deposition technique that involves the spontaneous adherence of organized organic structures on a wafer surface. This adherence involves adsorption of the organic structures from the vapor or liquid phase utilizing relatively weak interactions with the wafer surface. Initially, the structures are adsorbed on the surface by physisorption through, for instance, van der Waals forces or polar interactions. The self-assembled monolayers will then become confined to the surface by a chemisorption process. In some embodiments, the ability of SAM to grow layers as thin as a single molecule through chemisorption-driven interactions with the wafer surface(s) will be particularly useful in forming thin films including, for example, "near-zero-thickness" activation or barrier layers. SAM will also be particularly useful in area-selective deposition (ASD) (or area-specific deposition) using molecules that exhibit preferential reactions with specific segments of the underlying wafer surface in order to facilitate or obstruct subsequent material growth in the targeted areas. In some embodiments, SAM is used to form a foundation or blueprint region for subsequent area-selective ALD (AS-ALD) or area-selective CVD (AS-CVD).

The ALD, MLD, and SAM processes represent viable options for manufacturing thin layers (in some embodiments, the manufactured layers are only few atoms thick) that exhibit sufficient uniformity, conformality, and/or purity for the intended IC device application. By delivering the constituents of the material systems being manufactured both individually and sequentially into the processing environment, these processes and the precise control of the resulting surface chemical reactions allow for excellent control of processing parameters and the target composition and performance of the resulting film(s).

Figure 7:
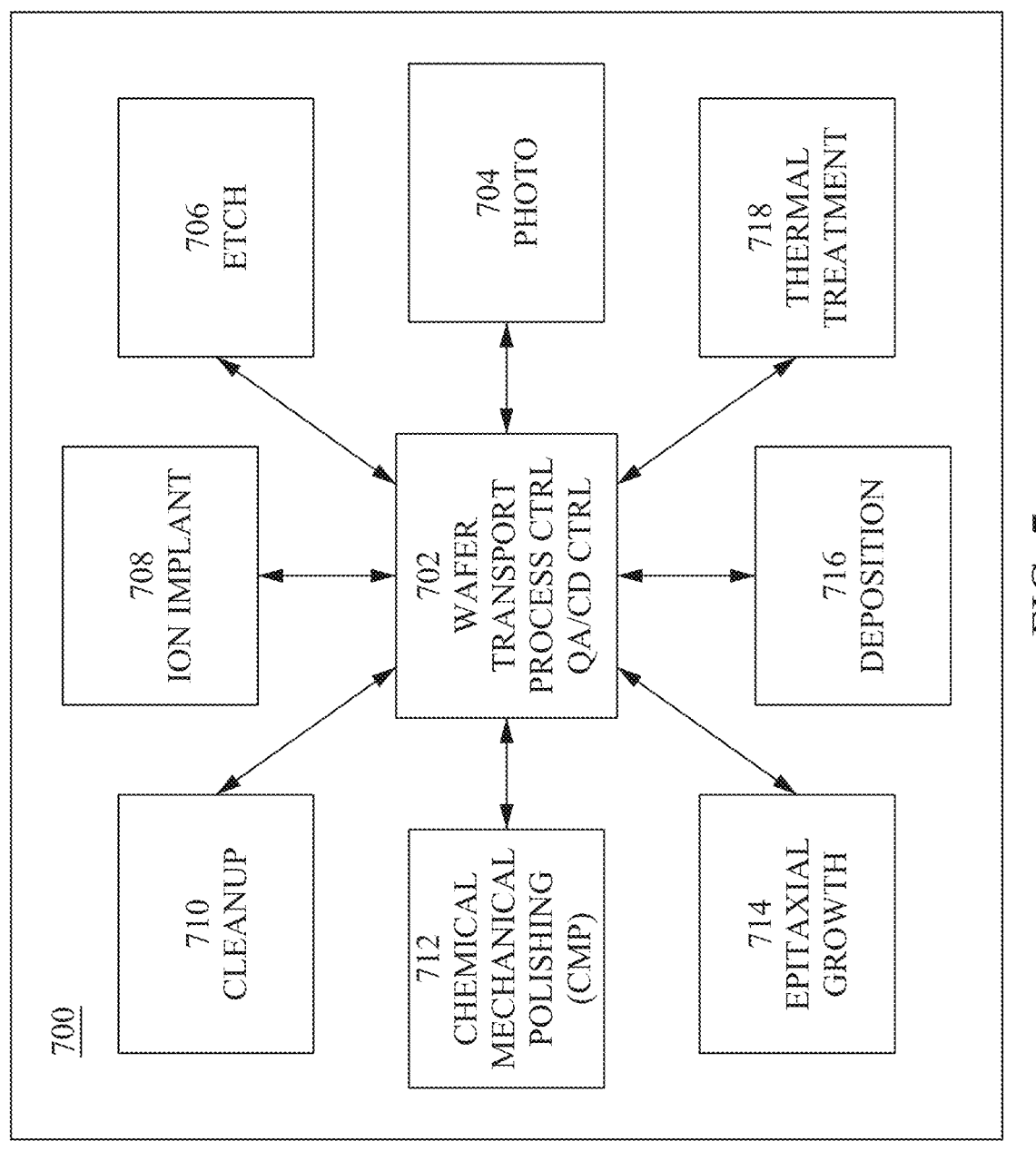
FIG. 7 is a schematic diagram of a processing system for manufacturing of IC devices according to some embodiments.

FIG. 7 is a schematic diagram of various processing departments defined within a Fab/Front End/Foundry for manufacturing IC devices according to some embodiments.

The processing departments utilized in both front end of line (FEOL) and back end of line (BEOL) IC device manufacturing typically include a wafer transport operation 702 for moving the wafers between the various processing departments. In some embodiments, the wafer transport operation will be integrated with an electronic process control (EPC) system according to FIG. 5 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 702 will be the various processing departments providing, for example, photolithographic operations 704, etch operations 706, ion implant operations 708, clean-up/strip operations 710, chemical mechanical polishing (CMP) operations 712, epitaxial growth operations 714, deposition operations 716, and thermal treatments 718.

Some embodiments of methods for making a semiconductor device include the operations of identifying a first position in a first semiconductor device layout at which adding an additional gate via would be advantageous, but in which the first position is unavailable due to an original location of a gate cut feature that has a first width, determining a first direction and a first distance by which to shift the gate cut feature to a secondary position that will allow for placement of the additional gate via in the first position, and shifting the gate cut feature by the first distance in the first direction to form a first modified semiconductor device layout.

Some embodiments of methods for making a semiconductor device include one or more additional operations or modifications including, for example, using the gate cut feature to indicate a location where a gate electrode is separated into a first portion comprising part of a first conductive network and a second portion comprising part of a second conductive network, determining whether the additional gate via would improve a function of the first conductive network, and shifting the gate cut feature toward the second conductive network by the first distance in response to the determination that the additional gate via would improve the function of the first conductive network; reducing a width of the gate cut feature from the first width to a second width; forming an extended gate endcap on the first portion of the gate electrode, wherein the extended endcap meets an endcap minimum length design rule; adding the additional gate via on the first portion of the gate electrode, wherein the extended endcap is between the additional gate via and an end face of the second portion of the gate electrode; determining whether adding the additional gate via allows the elimination of a conductive element while maintaining a design functionality of the semiconductor device and removing the conductive element from the first modified semiconductor device layout to form a second modified semiconductor device layout in light of such a determination; determining whether adding the additional gate via allows the elimination of a plurality of conductive elements while maintaining a desired functionality of the semiconductor device and removing the conductive elements from the first modified semiconductor device layout to form a second modified semiconductor device layout in light of such a determination; wherein forming the second modified semiconductor device layout comprises forming the second modified semiconductor device layout having a width no greater than three contact poly pitches (3CPP);

positioning the gate cut feature at the secondary position places the gate isolation structure at least partially overlapped with a conductive element; and/or forming the first modified semiconductor device layout includes forming the first modified semiconductor device layout including a conductive pattern having four conductive elements extending over the gate electrode and positioning the gate cut feature at the secondary position places the gate isolation structure at least partially overlapped with a medial conductive element of the four conductive elements.

Some embodiments of methods for making a semiconductor device include the operations of manufacturing a gate electrode on a substrate, etching a first portion of the gate electrode to form a first gate isolation opening, filling the first gate isolation opening with a first dielectric, etching a first backside portion of the integrated circuit device to form a second gate isolation opening that exposes a lower surface of the first dielectric, and filling the second gate isolation opening with a second dielectric, the first and second dielectrics forming a gate isolation structure that separates the gate electrode into a first portion and a second portion.

Some embodiments of methods for making a semiconductor device include one or more additional operations or modifications including, for example, manufacturing a multilayer interconnect structure before etching the first backside portion of the integrated circuit device; removing a first backside portion of the substrate to expose a lower surface of a substrate isolation structure; and using a residual portion of the semiconductor substrate as an etch mask for etching the backside portion of the integrated circuit device; removing a portion of the first dielectric in forming the second gate isolation opening; and/or forming an upper conductive layer on the gate electrode and etching the backside portion of the integrated circuit device to expose a lower surface of the upper conductive layer.

Some embodiments semiconductor devices include a first gate electrode, wherein the first gate electrode is divided into a first portion and a second portion by a gate isolation structure extending perpendicularly to the first gate electrode, a second gate electrode adjacent the first gate electrode, wherein the second gate electrode is divided into a first portion and a second portion by the gate isolation structure, and an array of conductive elements extending perpendicularly across the first and second gate electrodes, wherein the gate isolation structure is arranged at least partially below a single one of the conductive elements.

Some embodiments semiconductor devices include one or more additional elements or modifications including, for example, an array of conductive elements including four parallel conductive elements with the gate isolation structure extending under a medial one of the conductive elements; a substrate isolation structure that extends below a plane defined by an upper surface of the substrate isolation structure; a first set of gate vias that provide an electrical connection between the first gate electrode and a first conductive element and a second conductive element and a second set of gate vias that provide an electrical connection between the second gate electrode and the first conductive element and a third conductive element; and/or a configuration in which a width of the semiconductor device does not exceed a distance equal to three times a value of a contacted polysilicon pitch (CPP) as determined by the device layout and/or design rules.

A semiconductor device according to some embodiments includes a first gate structure having a first end cap portion, a second gate structure having a second end cap portion coaxial with the first gate structure, a first dielectric region separating the first end cap portion and the second end cap portion, a first conductive element extending over the first gate structure, a second conductive element extending over the second gate structure, and a gate via electrically connecting the second gate structure and the second conductive element, with the first dielectric region having a first width and being positioned at least partially under the first conductive element and defines a spacing between the gate via and an end of the second end cap portion that exceeds a predetermined distance.

Other embodiments of the semiconductor device include one or more additional features including having a majority of the first dielectric region is under the first conductive element; a third gate structure having a third end cap portion, a fourth gate structure having a fourth end cap portion coaxial with the third gate structure, a second dielectric region separating the third end cap portion and the fourth end cap portion, the first conductive element extending over the third gate structure, the second conductive element extending over the fourth gate structure, a third conductive element extending over the first and third gate structures, and a second gate via electrically connecting the fourth gate structure and the third conductive element, with the second dielectric region having a second width and is at least partially under the first conductive element and defines a spacing between the gate via and an end of the fourth end cap portion that exceeds a predetermined distance: a second gate via electrically connecting the fourth gate structure and the third conductive element; a fourth conductive element extending across the first gate structure, and a fifth conductive element extending across the third gate structure, with the fifth conductive element being coaxial with the fourth conductive element; a third gate via providing an electrical connection between the first gate structure and the fourth conductive element; a fourth gate via electrically connecting the third gate structure and the fifth conductive element; a first conductor adjacent the first and second gate structures, with the first conductor extending over the first, second, third, and fourth conductive elements, and a second conductor adjacent the third and fourth gate structures, with the second conductor extending over the first, second, third, and fifth conductive elements; a first metal via electrically connecting the first conductor and the fourth conductive element, a second metal via electrically connecting the second conductor and the fifth conductive element, a third metal via electrically connecting the first conductor and the second conductive element, and a fourth metal via electrically connecting the second conductor and the third conductive element; and/or an arrangement in which the first conductor, the first, second, third, and fourth gate structures, and the second conductor have a combined width of not more than 3 contacted poly pitches (3 CPP).

A semiconductor device according to some embodiments includes a first gate electrode having a first terminal portion, a second gate electrode having a second terminal portion, a gate isolation structure separating the first terminal portion from the second terminal portion, a first conductive element extending perpendicularly across the first gate electrode, and a second conductive element extending perpendicularly across the second gate electrode, with the first and second conductive elements being separated by a first dielectric region having a first width, with the gate isolation structure including a first portion under the first conductive element and a second portion under a second width of the first dielectric region with the second width being less than the first width.

Other embodiments of the semiconductor device include one or more additional features including having the first width is greater than the second width; a gate via providing an electrical connection between the second conductive element and the second gate electrode, thereby establishing a separation distance between the gate via and the second terminal portion that satisfies a predetermined spacing rule; a substrate, and a substrate isolation structure in the substrate, wherein the gate isolation structure extends below a plane defined by an upper surface of the substrate isolation structure; and/or a gate isolation structure that extend to a plane defined by a lower surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first gate structure having a first end cap portion;
a second gate structure having a second end cap portion coaxial with the first gate structure;
a first dielectric region separating the first end cap portion and the second end cap portion;
a first conductive element extending over the first gate structure;
a second conductive element extending over the second gate structure, wherein the second conductive element is discontinuous with the first conductive element; and
a gate via electrically connecting the second gate structure and the second conductive element,
wherein the first dielectric region has a first width and is at least partially under the first conductive element and defines a spacing between the gate via and an end of the second end cap portion that exceeds a predetermined distance.

2. The semiconductor device of claim 1, wherein:
a majority of the first dielectric region is under the first conductive element.

3. The semiconductor device of claim 1, further comprising:
a third gate structure having a third end cap portion;
a fourth gate structure having a fourth end cap portion coaxial with the third gate structure;
a second dielectric region separating the third end cap portion and the fourth end cap portion;
the first conductive element extending over the third gate structure;
the second conductive element extending over the fourth gate structure;
a third conductive element extending over the first and third gate structures; and
a second gate via electrically connecting the fourth gate structure and the third conductive element,
wherein the second dielectric region has a second width and is at least partially under the first conductive element whereby a spacing between the gate via and the fourth end cap portion meets the minimum spacing rule.

4. The semiconductor device of claim 3, further comprising:
a second gate via electrically connecting the fourth gate structure and the third conductive element.

5. The semiconductor device of claim 4, further comprising:
a fourth conductive element extending across the first gate structure; and
a fifth conductive element extending across the third gate structure, wherein the fifth conductive element is coaxial with the fourth conductive element.

6. The semiconductor device of claim 5, further comprising:
a third gate via providing an electrical connection between the first gate structure and the fourth conductive element.

7. The semiconductor device of claim 6, further comprising:
a fourth gate via electrically connecting the third gate structure and the fifth conductive element.

8. The semiconductor device of claim 7, further comprising:
a first conductor adjacent the first and second gate structures, wherein the first conductor extends over the first, second, third, and fourth conductive elements; and
a second conductor adjacent the third and fourth gate structures, wherein the second conductor extends over the first, second, third, and fifth conductive elements.

9. The semiconductor device of claim 8, further comprising:
a first metal via electrically connecting the first conductor and the fourth conductive element;
a second metal via electrically connecting the second conductor and the fifth conductive element;
a third metal via electrically connecting the first conductor and the second conductive element; and
a fourth metal via electrically connecting the second conductor and the third conductive element.

10. The semiconductor device of claim 9, wherein:
the first conductor, the first, second, third, and fourth gate structures, and the second conductor have a combined width of not more than 3 contacted poly pitches (3 CPP).

11. A method of manufacturing an integrated circuit device, comprising:
manufacturing a gate electrode on a substrate;
etching a first portion of the gate electrode to form a first gate isolation opening;
filling the first gate isolation opening with a first dielectric;
etching a first backside portion of the integrated circuit device to form a second gate isolation opening, wherein the second gate isolation opening exposes a lower surface of the first dielectric; and
filling the second gate isolation opening with a second dielectric, the first and second dielectrics forming a gate isolation structure that separates the gate electrode into a first portion and a second portion.

12. The method according to claim 11, further comprising:
manufacturing a multilayer interconnect structure before etching the first backside portion of the integrated circuit device.

13. The method according to claim 11, further comprising:

removing a first backside portion of the substrate to expose a lower surface of a substrate isolation structure; and using a residual portion of the substrate as an etch mask for etching the backside portion of the integrated circuit device.

14. The method according to claim 11, further comprising:

removing a portion of the first dielectric in forming the second gate isolation opening.

15. The method according to claim 11, further comprising:

forming an upper conductive layer on the gate electrode; and etching the backside portion of the integrated circuit device to expose a lower surface of the upper conductive layer.

16. A semiconductor device, comprising:

a first gate electrode having a first terminal portion;

a second gate electrode having a second terminal portion;

a gate isolation structure separating the first terminal portion from the second terminal portion;

a first conductive element extending perpendicularly across the first gate electrode; and a second conductive element extending perpendicularly across the second gate electrode, wherein the first and second conductive elements are separated by a first dielectric region having a first width, wherein the gate isolation structure consists of a first portion under the first conductive element and a second portion under a second width of the first dielectric region with the second width being less than the first width.

17. The semiconductor device according to claim 16, wherein:

the first width is greater than the second width.

18. The semiconductor device according to claim 16, further comprising:

a gate via providing an electrical connection between the second conductive element and the second gate electrode, wherein a separation distance between the gate via and the second terminal portion satisfies a spacing rule.

19. The semiconductor device according to claim 16, further comprising:

a substrate; and a substrate isolation structure in the substrate, wherein the gate isolation structure extends below a plane defined by an upper surface of the substrate isolation structure.

20. The semiconductor device according to claim 19, wherein:

the gate isolation structure extends to a plane defined by a lower surface of the substrate.

*    *    *    *    *